US006278223B1

United States Patent
Sasaki et al.

(10) Patent No.: US 6,278,223 B1
(45) Date of Patent: Aug. 21, 2001

(54) DIFFERENTIAL TYPE PIEZOELECTRIC ACTUATOR

(75) Inventors: Yasuhiro Sasaki; Atsushi Ochi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/577,203

(22) Filed: May 23, 2000

(30) Foreign Application Priority Data

May 24, 1999 (JP) .................................................. 11-143293

(51) Int. Cl.[7] .................................................. H01L 41/04
(52) U.S. Cl. ............................................. 310/328; 310/358
(58) Field of Search ..................................... 310/328, 358

(56) References Cited

U.S. PATENT DOCUMENTS 4,613,782 * 9/1986 Mori ...................................... 310/328
6,066,911 * 5/2000 Lindemann ........................... 310/328

FOREIGN PATENT DOCUMENTS 3-283580   12/1991  (JP) .
4-232678    8/1992  (JP) .
2529380     6/1996  (JP) .

* cited by examiner

Primary Examiner—Nicholas Ponomarenko
Assistant Examiner—Karen B Addison
(74) Attorney, Agent, or Firm—Young & Thompson

(57) ABSTRACT

The differential type piezoelectric actuator comprises: a drive body having a unitary block of two piezoelectric element blocks and a base block formed from a material constituting the piezoelectric element blocks; and a support spring fixed to free ends in the longitudinal direction of the two piezoelectric element blocks, wherein a differential displacement obtained by expansion and contraction of the two piezoelectric element blocks generates a rotary movement of a tip end of the support spring.

24 Claims, 5 Drawing Sheets

DIFFERENTIAL TYPE PIEZOELECTRIC ACTUATOR

BACKGROUND OF THE INVENTION

1. Field of the Invention

The present invention relates to a differential type piezoelectric actuator and in particular, to a differential type piezoelectric actuator of a high reliability which can control a very small displacement with a high accuracy and which can easily be mounted.

2. Description on the Prior Art

With a technical innovation nowadays, more and more fine and accurate positioning mechanism is required such as in a magnetic recording apparatus, a scan type tunnel microscope, an interatomic force microscope, and a stepper used in a semiconductor production apparatus. A piezoelectric material has a characteristic to expand and contract when voltage is applied and this displacement amount can be modified by the material, size, and voltage applied. An actuator employing such a piezoelectric material can control a very small displacement with a high accuracy and attracts attention of engineers. Moreover, a piezoelectric actuator has an advantage over an electromagnetic actuator in that no coil is required, the electromagnetic noise is low, and the size can be reduced.

Japanese Patent Publication No. 4-232678 [1] and others disclose a magnetic head positioning mechanism utilizing a differential type piezoelectric element in a magnetic disc apparatus. In this magnetic head positioning mechanism, two piezoelectric elements fixed to a head arm are connected to a support portion, and a pressure generated by expansion and contraction of the piezoelectric elements is transmitted to the support portion, which in turn rotates a tip end of a support spring connected to the support portion. Thus, positioning is controlled.

Moreover, Japanese Patent Publication No. 3-283580 [2] discloses a mechanism to enlarge a displacement generated by two piezoelectric elements, and Japanese Patent No. 2529380 [3] discloses a head positioning mechanism in which two piezoelectric elements are used to move a support spring in a radial direction of a disc.

However, the piezoelectric elements in the mechanism disclosed in document [1] are connected to both ends of movement of the elements. The pressure transmission loss at the connecting points is large. In order to compensate this loss, the piezoelectric element size should be large and the transmission loss generates a displacement hysteresis, which makes it difficult to control positioning with a high accuracy. Moreover, a stress generated by the repeated drive of the piezoelectric elements causes a destruction at the connection boundary, deteriorating reliability. Moreover, since both ends of the two piezoelectric elements are fixed, the size accuracy should be strict and a size adjustment by machining costs a lot.

SUMMARY OF THE INVENTION

It is therefore an object of the present invention to provide a differential type actuator of a high reliability which can control a very small displacement with a high accuracy and can easily be assembled and mounted.

The differential type piezoelectric actuator according to the present invention comprises: a drive body having a unitary block of two piezoelectric element blocks and a base block formed from a material constituting the piezoelectric element blocks; and a support spring fixed to free ends in the longitudinal direction of the two piezoelectric element blocks, wherein a differential displacement obtained by expansion and contraction of the two piezoelectric element blocks generates a rotary movement of a tip end of the support spring.

According to another aspect of the invention, a stepped portion is provided at a corner of each free end of the piezoelectric element blocks.

According to still another aspect of the invention, the support spring has two protrusions at its end to be fixed to the free ends of the two piezoelectric element blocks, the two protrusions being fixed to the respective free ends of the two piezoelectric element blocks.

According to yet another aspect of the present invention, an electrode is arranged on both main surfaces of the piezoelectric element blocks in a thickness direction for applying voltage causing expansion and contraction of the piezoelectric element blocks in the length direction.

According to still yet another aspect of the present invention, each of the piezoelectric element blocks is made from conductive layers and piezoelectric material layers which are alternately layered in the thickness direction, and the expansion and contraction of the piezoelectric element blocks is obtained by expansion and contraction in the length direction generated when voltage is applied via the conductive layers.

According to yet another aspect of the present invention, an electrode is provided at the tip end and the bottom in the length direction of the respective piezoelectric element blocks, and the expansion and contraction of the piezoelectric element blocks is obtained by expansion and contraction in the length direction generated when voltage is applied in the length direction via the electrodes.

According to still another aspect of the present invention, each of the piezoelectric element blocks includes conductive layers and piezoelectric material layers which are alternately layered in the length direction, and the expansion and contraction of the piezoelectric element blocks is obtained by expansion and contraction in the length direction generated when voltage is applied in the thickness direction via the conductive layers.

According to still yet another aspect of the present invention, each of the piezoelectric element blocks is provided with electrodes arranged on its both main surfaces in the width direction, and the expansion and contraction of the piezoelectric element blocks is obtained by expansion and contraction in the length direction generated when voltage is applied in the width direction via the electrodes.

According to still another aspect of the present invention, each of the piezoelectric element blocks includes conductive layers and piezoelectric material layers which are alternately layered in the width direction, and the expansion and contraction of the piezoelectric element blocks is obtained by expansion and contraction in the length direction generated when voltage is applied in the width direction via the conductive layers.

DESCRIPTION OF THE PREFERRED EMBODIMENTS

Hereinafter, explanation will be given on embodiments of the present invention with reference to the attached drawings.

Figure 1A:
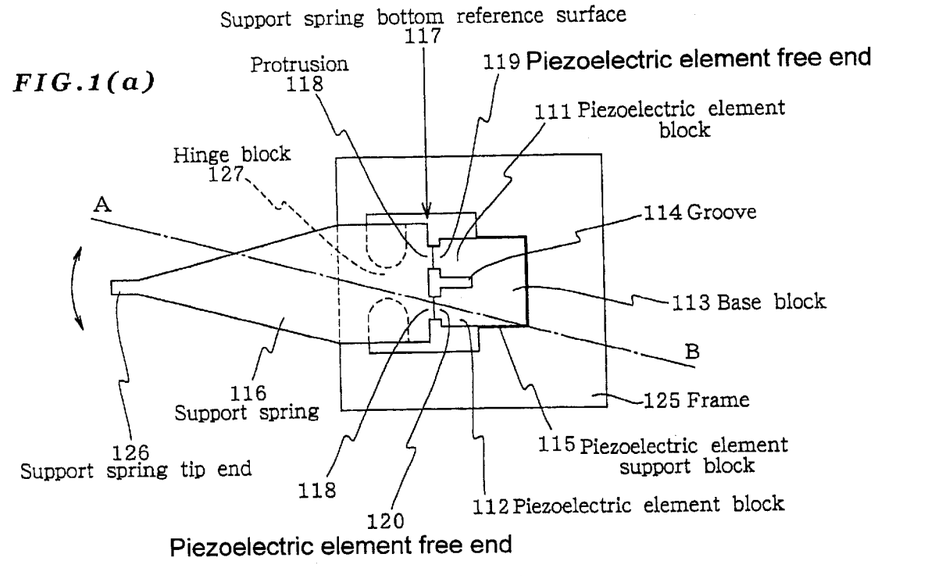
FIG. 1(a) is a plan view.
Figures 1B, 1C, 1D:
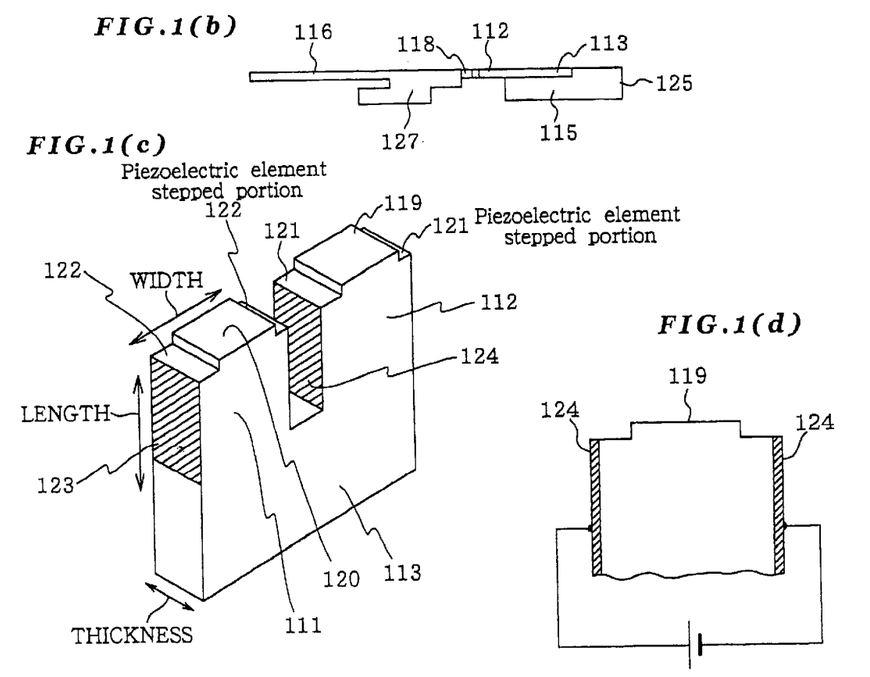
FIG. 1(b) is a cross sectional view of an essential portion of a differential type piezoelectric actuator according to an embodiment of the present invention.
FIG. 1(c) is a perspective view of a drive body.
FIG. 1(d) explains voltage application to a piezoelectric block.

FIG. 1(a) is a plan view of an essential portion of a differential type piezoelectric actuator according to a representative embodiment of the present invention; FIG. 1(b) is a cross sectional view about the line AB in FIG. 1(a); FIG. 2(c) is a perspective view of a drive body including two piezoelectric element blocks made into a unitary block together with a base block; and FIG. 2(d) explains voltage application to the piezoelectric element blocks.

As shown in FIG. 1, the two piezoelectric element blocks 111 and 112, and a base block 113 which is made from a material comprising the piezoelectric element blocks are formed into a U-shaped unitary block having a groove 114, i.e., a drive body for driving a support spring 116. The base block 113 is fixed to a supporting block 115 of a frame 125 and free ends of the respective piezoelectric element blocks 111 and 112 are fixed to the support spring 116, so that a rotary movement is generated at the tip end 126 of the support spring by a differential displacement obtained by the expansion and contraction of the two piezoelectric element blocks 111 and 112, thus constituting an actuator. The support spring 116 is fixed through a hinge block 127 to the frame 125.

In the aforementioned differential type piezoelectric actuator, each of the two piezoelectric element blocks 111 and 112 is made to expand and contract independently so as to bend the hinge block 127 and vibration caused by the difference between expansion and contraction in the length direction (as shown in FIG. 1(c)) is transmitted to the support spring 116, thus generating a rotary movement of the support spring tip end 126.

Moreover, since the base block 113 unitarily made with the piezoelectric element blocks 111 and 112 does not vibrate, by fixing the base block 113 to the support block 115, it is possible to obtain a fixation of a high reliability without disturbing the vibration of the piezoelectric element blocks. The free ends 119 and 120 of the piezoelectric element blocks 111 and 112 are connected to a reference surface 117 at the bottom of the support spring 116, so that the fixing position of the base block 113 to the support block 115 can be adjusted. Thus, there is no need of strict dimensional adjustment of the piezoelectric element blocks 111 and 112. this reduces the production cost.

Moreover, by providing two protrusions 118 at the bottom reference surface 117 of the support spring 116, it becomes easy to position the piezoelectric element blocks 111 and 112 when fixing their free ends to the support spring 116. Furthermore, by providing a stepped portion at the corners of the free ends 119 and 120 of the piezoelectric element blocks 111 and 112, it is possible to prevent flowing of an adhesive used for fixing the piezoelectric element blocks 111 and 112 to the support spring 116, over a side surface of the piezoelectric blocks 111 and 112, thus enabling to obtain a preferable connection.

In the piezoelectric element blocks 111 and 112 shown in FIG. 1, electrodes 123 and 124 are formed on the both main surfaces of the width direction and an electric field is applied in the width direction (shown in FIG. 1(c)), so that expansion and contraction are obtained in the length direction. However, it is also possible to form the electrodes on the both main surfaces of the thickness direction (shown in FIG. 1(c)) and an electric field is applied in the thickness direction, so that expansion and contraction are obtained in the length direction. Alternatively, it is possible to form electrodes in the length direction and an electric field is applied in the length direction, so that expansion and contraction are obtained in the length direction. Moreover, the piezoelectric element block can reduce a drive voltage by alternately arranging a piezoelectric material and an electrode material (conductive material) so as to form a layered configuration.

EXAMPLES

Hereinafter, examples of the present invention will be detailed with reference to the attached drawings.

Example 1

Figure 2A:
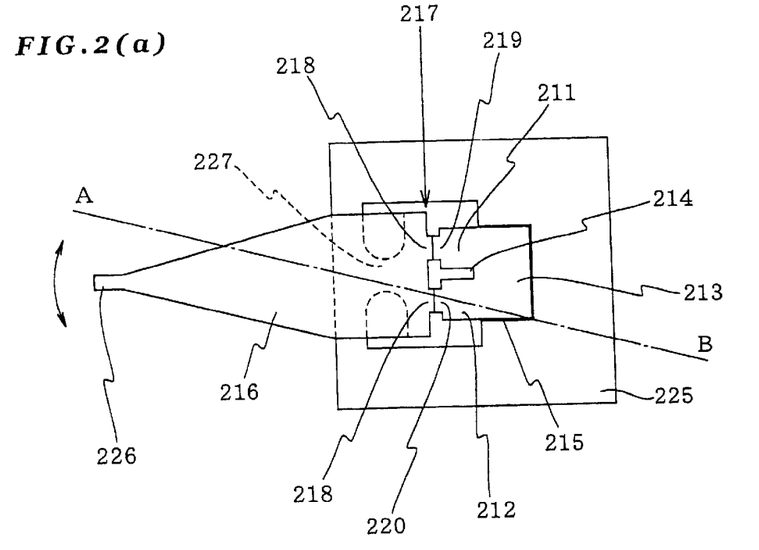
FIG. 2(a) is plan view.
Figures 2B, 2C, 2D:
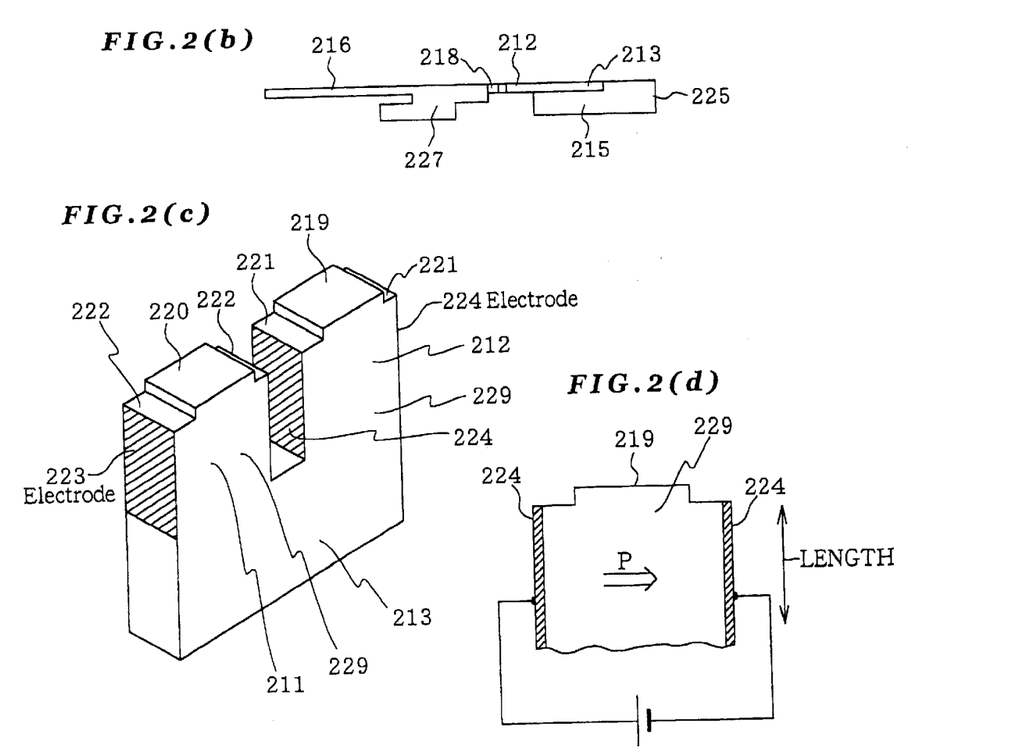
FIG. 2(b) is a cross sectional view of an essential portion of example 1 of the differential type piezoelectric actuator according to the present invention.
FIG. 2(c) is a perspective view of a drive body.
FIG. 2(d) explains voltage application to piezoelectric element blocks.

FIG. 2(a) is a plan view of an essential portion of an example of a differential type actuator according to the present invention; FIG. 2(b) is a cross sectional view about the line AB in FIG. 2(a); FIG. 2(c) is a perspective view of a drive body consisting of two piezoelectric element blocks and a base block which are formed into a unitary block; and FIG. 2(d) explains voltage application to the piezoelectric element blocks. It should be noted that configuration and operation of this example is identical to the configuration and the operation of the embodiment of FIG. 1.

A support spring 216 was fixed through a hinge block 227 to a frame 225. These were formed using a SUS material. A drive body (FIG. 2(c)) consisting of piezoelectric element blocks 211 and 212 and the base block 213 was prepared by the green sheet method. The drive body was fixed to a reference surface 217 at the bottom of the support spring 216 having a length of 10 mm. The drive body consisted of two piezoelectric element blocks 211 and 212 and the base block 213 which were made into a unitary U-shaped block having a groove 214. The piezoelectric element blocks 211 and 212 had electrodes 223 and 224, respectively, formed by a silver conductive on the both main surfaces of the width direction. By applying voltage to the electrodes 223 and 224, the drive body was polarized in the width direction (direction indicated by an arrow P in FIG. 2(d)) and expansion and contraction were generated in the length direction of the piezoelectric element blocks 211 and 212. The base block 213 was fixed to the support block 215 provided on the frame 225. Here, an epoxy adhesive was used to fix the piezoelectric element blocks 211, 212 to the support spring 216 and to the support block 215. Moreover, the drive body including the piezoelectric element blocks was formed by lead zirconate titanate (PZT) ceramics with length of 2 mm, width of 1 mm, thickness of 0.2 mm and the distance between the two piezoelectric element blocks was set to 0.8 mm. Each of the stepped portions 221, 222 of the piezoelectric element blocks was set to 0.050 mm both in length and width, and protrusions 219, 220 of the piezoelectric element blocks had a size identical to the size of the two protrusions 218 at the bottom of the support spring 216.

The two protrusions 218 provided at the bottom reference surface 217 of the support spring 216 facilitate positioning of the free ends 219, 220 of the piezoelectric element blocks 211, 212 when fixing them to the support spring 216. Furthermore, the step portions 221, 222 provided at the corners of the free ends 219, 220 of the piezoelectric element blocks 211, 212 can prevent flow of an adhesive used when fixing the piezoelectric element blocks 211, 212 to the support spring 216, over the side surface of the piezoelectric element blocks, thus enabling to obtain a preferable fixing state.

When a DC field of –125 to +125 V was applied to each of the piezoelectric element blocks 211, 212 via the electrodes 223, 224, the piezoelectric element blocks expanded and contracted in the length direction according to the intensity of the electric field and the hinge block 227 was bent. This differential displacement was transmitted to the support spring 216, causing a rotary movement of the tip end 226 of the support spring. Based on the support spring tip end position before applying the electric field, the rotary movement of the support spring tip end was in a range from –0.1 to +0.1 micrometer and it was possible to control in this range with a high accuracy.

Example 2

Figure 3A:
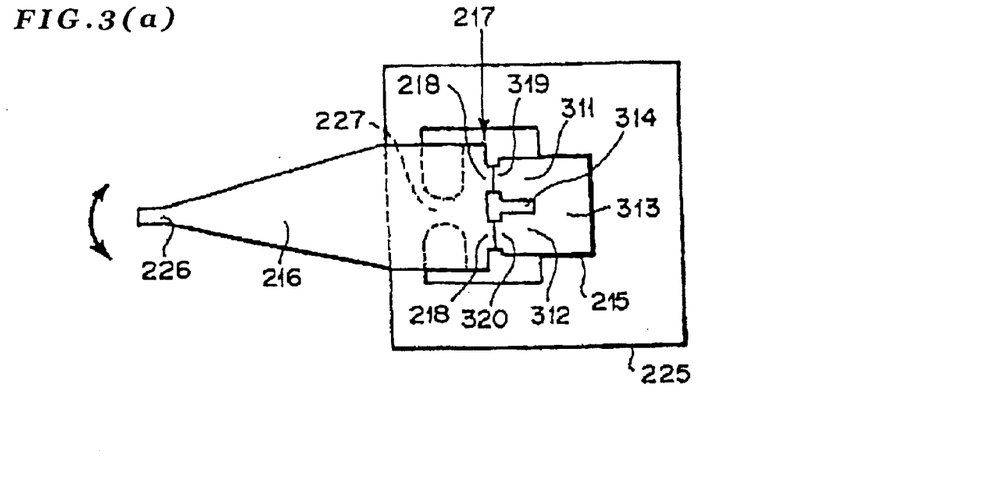
FIG. 3(a) is a plan view of an essential portion of example 2 of the differential type piezoelectric actuator according to the present invention.
Figure 3B:
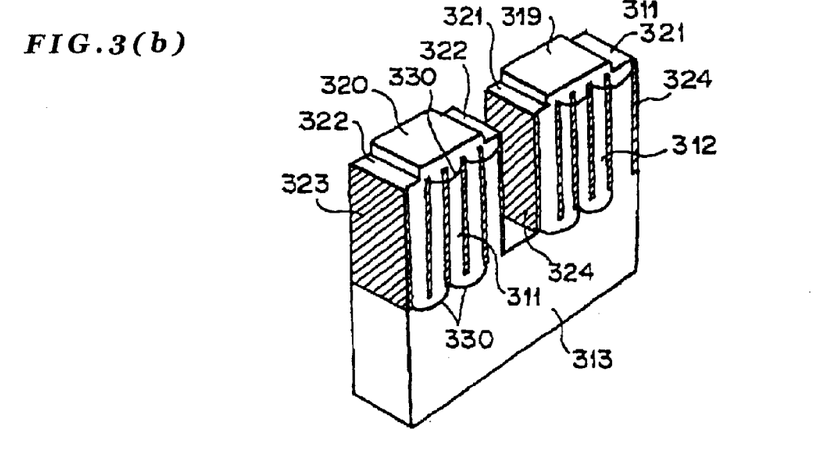
FIG. 3(b) is a perspective view of a drive body.
Figure 3C:
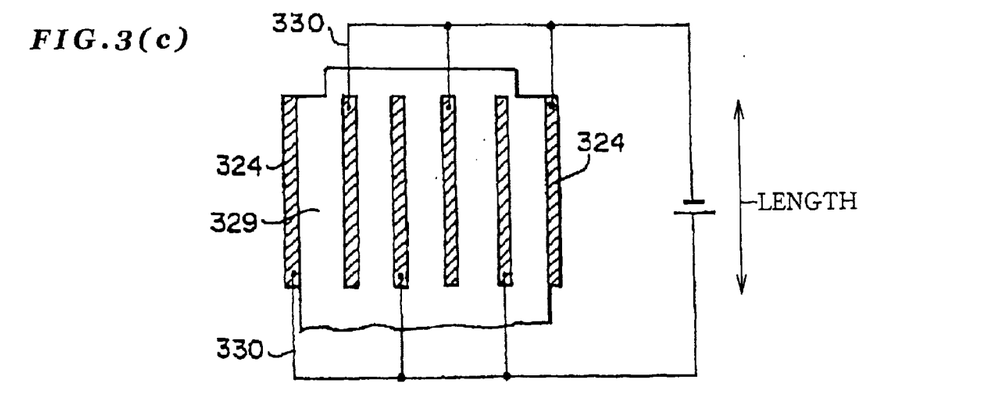
FIG. 3(c) explains voltage application to piezoelectric element blocks.

FIG. 3(a) is a plan view of an essential portion of another example of the differential type actuator according to the present invention; FIG. 3(b) is a perspective view of a drive body including two piezoelectric element blocks and a base block which are made into a unitary block; and FIG. 3(c) explains a voltage application method of the piezoelectric element blocks. In FIG. 3, like components as in the example of FIG. 2 are denoted by like reference symbols.

This example 2 differs from the example 1 in that the piezoelectric element blocks have layered configurations.

A support spring 216 was fixed via a hinge block 227 to a frame 225. These were prepared using SUS material. A drive body (FIG. 3(b)) including piezoelectric element blocks 311, 312 and a base block 313 was prepared using the green sheet method. The drive body was fixed to a reference surface 217 at the bottom of the support spring 216 having a length of 10 mm. The piezoelectric element block 311 included piezoelectric material layers 329 and silver-palladium electrodes 323 which were arranged alternately in the width direction of the piezoelectric element block. Similarly, the piezoelectric element block 312 included piezoelectric material layers 329 and silver-palladium electrodes 324 which were arranged alternately in the width direction of the piezoelectric element block. The electrode layers 323 were connected in parallel by wiring 330. Similarly, the electrode layers 324 were connected in parallel by wiring 330. Thus, the piezoelectric material layers were polarized alternately in the width direction. Here, the number of the piezoelectric material layers 329 was five for each of the piezoelectric element blocks 311, 312. Moreover, the drive body was formed into a U-shaped configuration including the two piezoelectric element blocks 311, 312, the base block 313 formed from a material identical to the piezoelectric layers, and a groove 314. The base block 313 was fixed to a support block 215 provided on the frame 225. An epoxy adhesive was used to fix the piezoelectric element blocks 311, 312 to the support spring 216, and to the support block 215. Moreover, the drive body including the piezoelectric element blocks was formed by lead zirconate titanate (PZT) ceramics with length of 2 mm, width of 1 mm, thickness of 0.2 mm and the distance between the two piezoelectric element blocks was set to 0.8 mm. Each of the stepped portions 321, 322 of the piezoelectric element blocks was set to 0.050 mm both in length and width, protrusions 319, 320 of the piezoelectric element blocks had a size identical to the size of the two protrusions 218 at the bottom of the support spring 216.

When a DC field of –25 to +25 V was applied to each of the piezoelectric element blocks 311, 312 via the electrodes 323, 324, the piezoelectric element blocks expanded and contracted in the length direction according to the intensity of the electric field and the hinge block 227 was bent. This differential displacement was transmitted to the support spring 216, causing a rotary movement of the tip end 226 of the support spring. Based on the support spring tip end position before applying the electric field, the rotary movement of the support spring tip end was in a range from –0.1 to +0.1 micrometer and it was possible to control in this range with a high accuracy. Moreover, with ⅕ of the electric field of example 1, an equivalent displacement was obtained.

Example 3

Figure 4A:
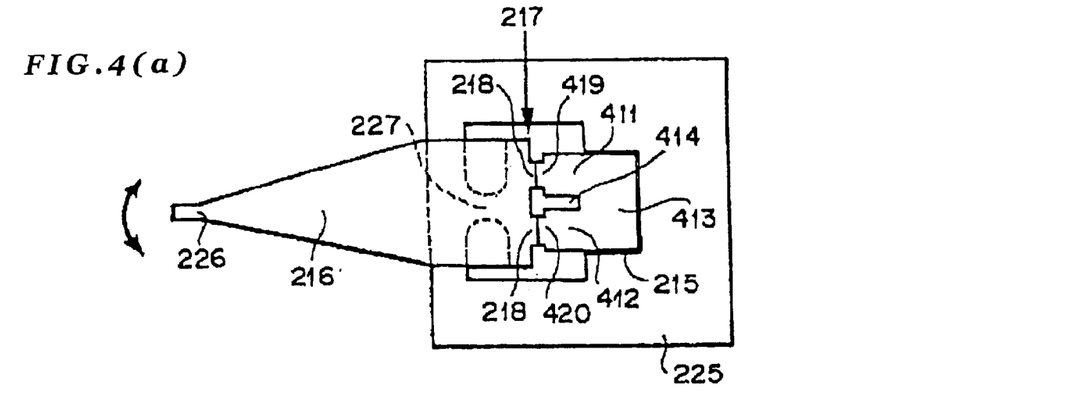
FIG. 4(a) is a plan view of an essential portion of example 3 of the differential type piezoelectric actuator according to the present invention.
Figure 4B:
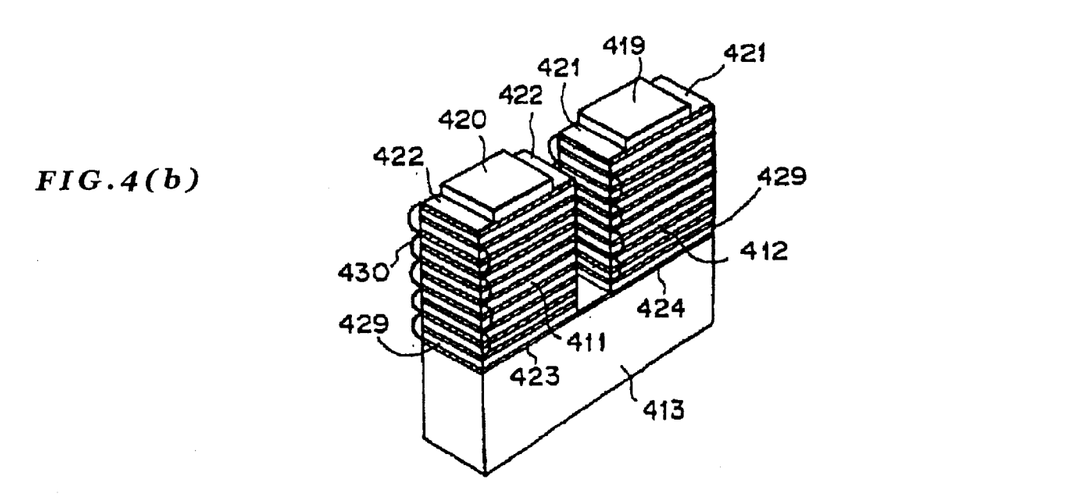
FIG. 4(b) is a perspective view of a drive body.
Figure 4C:
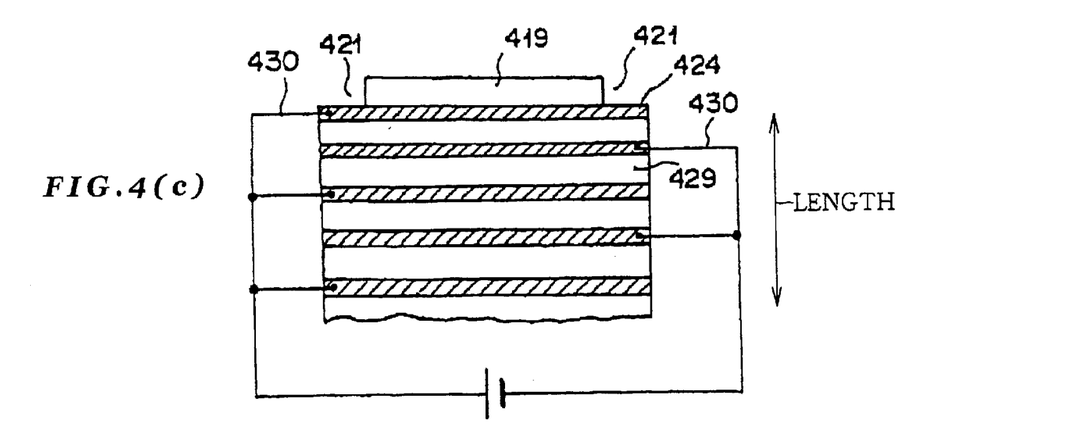
FIG. 4(c) explains voltage application to piezoelectric element blocks.

FIG. 4(a) is a plan view of an essential portion of another example of the differential type actuator according to the present invention; FIG. 4(b) is a perspective view of a drive body including two piezoelectric element blocks and a base block which are made into a unitary block; and FIG. 4(c) explains a voltage application method of the piezoelectric element blocks. In FIG. 4, like components as in the example of FIG. 2 are denoted by like reference symbols.

This example 3 differs from the other examples in that an electric field is applied in the length direction of the two piezoelectric element blocks and the piezoelectric element blocks expand and contract in the length direction.

A support spring 216 was fixed via a hinge block 227 to a frame 225. These were prepared using SUS material. A drive body (FIG. 4(b)) including piezoelectric element blocks 411, 412 and a base block 413 was prepared using the green sheet method. The drive body was fixed to a reference surface 217 at the bottom of the support spring 216 having a length of 10 mm. The piezoelectric element block 411 included piezoelectric material layers 429 and silver-palladium electrodes 423 which were arranged alternately in the length direction of the piezoelectric element block. Similarly, the piezoelectric element block 412 included piezoelectric material layers 429 and silver-palladium electrodes 424 which were arranged alternately in the width direction of the piezoelectric element block. The electrode layers 423 were connected in parallel by wiring 430. Similarly, the electrode layers 424 were connected in parallel by wiring 430. Thus, the piezoelectric material layers were polarized alternately in the length direction. Here, the number of the piezoelectric material layers 429 was ten for each of the piezoelectric element blocks 411, 412. Moreover, the drive body was formed into a U-shaped configuration including the two piezoelectric element blocks 411, 412, the base block 413 formed from a material identical to the piezoelectric layers, and a groove 414. The base block 413 was fixed to a support block 215 provided on the frame 225. An epoxy adhesive was used to fix the piezoelectric element blocks 411, 412 to the support spring 216, and to the support block 215. Moreover, the drive body including the piezoelectric element blocks was formed by lead zirconate titanate (PZT) ceramics with length of 2 mm, width of 1 mm, thickness of 0.2 mm and the distance between the two piezoelectric element blocks was set to 0.8 mm. Each of the stepped portions 421, 422 of the piezoelectric element blocks was set to 0.050 mm both in length and width. The protrusions 419, 420 of the piezoelectric element blocks had a size identical to the size of the two protrusions 218 at the bottom of the support spring 216.

When a DC field of −25 to +25 V was applied to each of the piezoelectric element blocks 411, 412 via the electrodes 423, 424, the piezoelectric element blocks expanded and contracted in the length direction according to the intensity of the electric field and the hinge block 227 was bent. This differential displacement was transmitted to the support spring 216, causing a rotary movement of the tip end 226 of the support spring. Based on the support spring tip end position before applying the electric field, the rotary movement (displacement) of the support spring tip end was in a range from −0.3 to +0.3 micrometers and it was possible to control in this range with a high accuracy. Moreover, with an identical electric field as example 2, a displacement of three times more was obtained.

Example 4

Figure 5A:
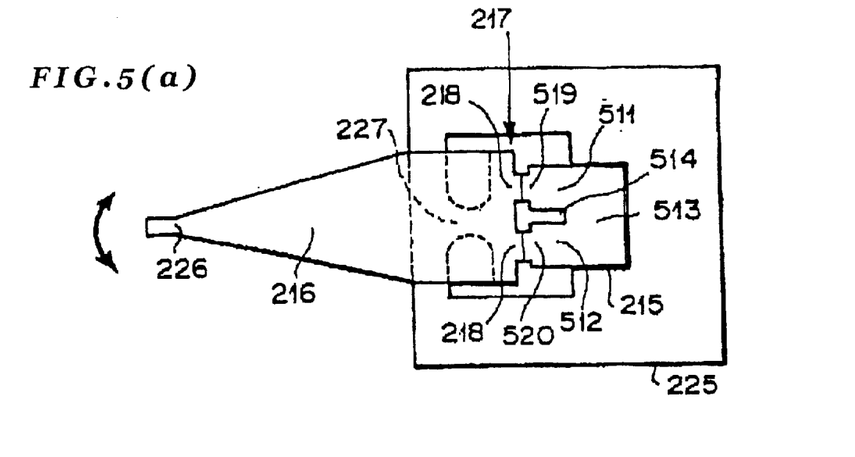
FIG. 5(a) is a plan view of an essential portion of example 4 of the differential type piezoelectric actuator according to the present invention.
Figure 5B:
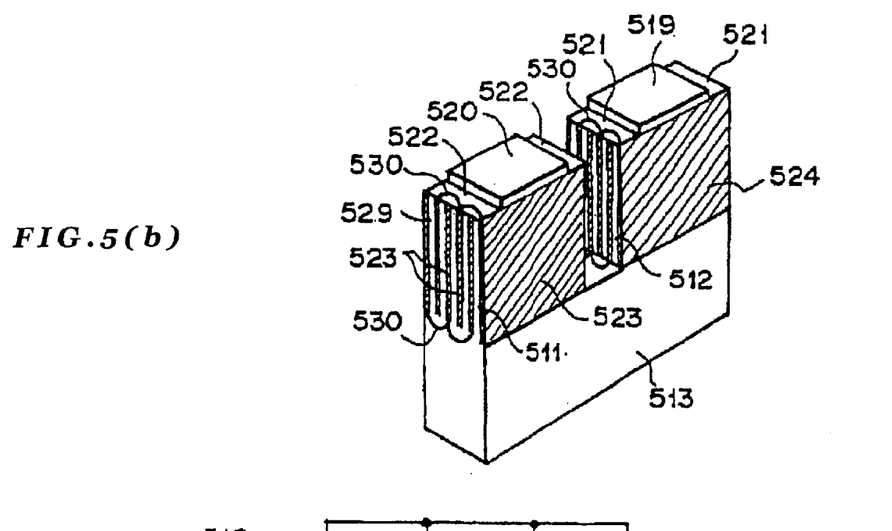
FIG. 5(b) is a perspective view of a drive body.
Figure 5C:
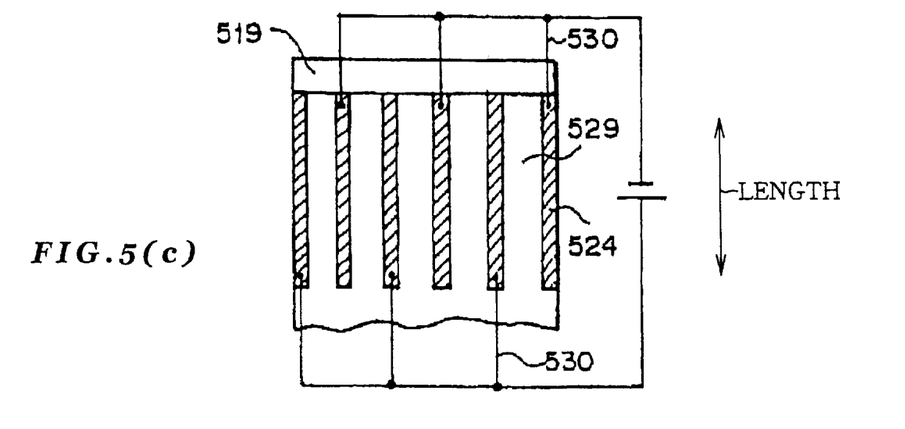
FIG. 5(c) explains voltage application to piezoelectric element blocks.

FIG. 5(a) is a plan view of an essential portion of another example of the differential type actuator according to the present invention; FIG. 5(b) is a perspective view of a drive body including two piezoelectric element blocks and a base block which are made into a unitary block; and FIG. 5(c) explains a voltage application method of the piezoelectric element blocks. In FIG. 5, like components as in the example of FIG. 2 are denoted by like reference symbols.

This example 4 differs from the other examples in that an electric field is applied in the thickness direction of the two piezoelectric element blocks and the piezoelectric element blocks expand and contract in the length direction.

A support spring 216 was fixed via a hinge block 227 to a frame 225. These were prepared using SUS material. A drive body (FIG. 5(b)) including piezoelectric element blocks 511, 512 and a base block 513 was prepared using the green sheet method. The drive body was fixed to a reference surface 217 at the bottom of the support spring 216 having a length of 10 mm. The piezoelectric element block 511 included piezoelectric material layers 529 and silver-palladium electrodes 523 which are arranged alternately in the thickness direction of the piezoelectric element block. Similarly, the piezoelectric element block 512 included piezoelectric material layers 529 and silver-palladium electrodes 524 which were arranged alternately in the width direction of the piezoelectric element block. The electrode layers 523 were connected in parallel by wiring 530. Similarly, the electrode layers 524 were connected in parallel by wiring 530. Thus, the piezoelectric material layers were polarized alternately in the thickness direction. Here, the number of the piezoelectric material layers 529 was five for each of the piezoelectric element blocks 511, 512. Moreover, the drive body was formed into a U-shaped configuration including the two piezoelectric element blocks 511, 512, the base block 513 formed from a material identical to the piezoelectric layers, and a groove 514. The base block 513 was fixed to a support block 215 provided on the frame 225. An epoxy adhesive was used to fix the piezoelectric element blocks 511, 512 to the support spring 216, and to the support block 215. Moreover, the drive body including the piezoelectric element blocks was formed by lead zirconate titanate (PZT) ceramics with length of 2 mm, width of 1 mm, thickness of 0.2 mm and the distance between the two piezoelectric element blocks was set to 0.8 mm. Each of the stepped portions 521, 522 of the piezoelectric element blocks was set to 0.050 mm both in length and width. The protrusions 519, 520 of the piezoelectric element blocks had a size identical to the size of the two protrusions 218 at the bottom of the support spring 216.

When a DC field of −5 to +5 V was applied to each of the piezoelectric element blocks 511, 512 via the electrodes 523, 524, the piezoelectric element blocks expanded and contracted in the length direction according to the intensity of the electric field and the hinge block 227 was bent. This differential displacement was transmitted to the support spring 216, causing a rotary movement of the tip end 226 of the support spring. Based on the support spring tip end position before applying the electric field, the rotary movement (displacement) of the support spring tip end was in a range from −0.1 to +0.1 micrometer and it was possible to control in this range with a high accuracy. Moreover, with $\frac{1}{25}$ of the electric field in example 2, an equivalent displacement was obtained.

The differential type actuator according to the present invention can be preferably used in a positioning apparatus in a magnetic head, magneto-optical head, and the like.

As has been described above, according to the present invention, it is possible to realize a differential type piezoelectric actuator of a high reliability which can control a fine displacement with a high accuracy and can easily be mounted. The present invention is expected as a key component of a high performance device and has a great industrial worth.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 11-143293 (Filed on May 24$^{th}$, 1999) including specification, claims, drawings and summary are incorporated herein by reference in its entirety.

What is claimed is:

1. A differential type piezoelectric actuator comprising:
   a drive body having a unitary block of two piezoelectric element sections and a base block formed from a material constituting the piezoelectric element sections; and
   a support spring fixed to free ends in a longitudinal direction of the two piezoelectric element sections,
   wherein a differential displacement obtained by expansion and contraction of the two piezoelectric element sections generates a rotary movement of a tip end of the support spring.

2. A differential type piezoelectric actuator as claimed in claim 1, wherein a stepped portion is provided at a corner of a free end of the piezoelectric element sections.

3. A differential type piezoelectric actuator as claimed in claim 1, wherein the support spring has two protrusions at its end to be fixed to the free ends of the two piezoelectric element sections, the two protrusions being fixed to the respective free ends of the two piezoelectric element sections.

4. A differential type piezoelectric actuator as claimed in claim 2, wherein the support spring has two protrusions at its end to be fixed to the free ends of the two piezoelectric element sections, the two protrusions being fixed to the respective free ends of the two piezoelectric element sections.

5. A differential type piezoelectric actuator as claimed in claim 1, wherein an electrode is arranged on both main surfaces of the piezoelectric element sections in a thickness direction for applying voltage causing expansion and contraction of the piezoelectric element sections.

6. A differential type piezoelectric actuator as claimed in claim 2, wherein an electrode is arranged on both main surfaces of the piezoelectric element sections in a thickness direction for applying voltage causing expansion and contraction of the piezoelectric element sections.

7. A differential type piezoelectric actuator as claimed in claim 3, wherein an electrode is arranged on both main surfaces of the piezoelectric element sections in a thickness direction for applying voltage causing expansion and contraction of the piezoelectric element sections.

8. A differential type piezoelectric actuator as claimed in claim 1, wherein
   each of the piezoelectric element sections is made from conductive layers and piezoelectric material layers which are alternately layered in a thickness direction, and
   the expansion and contraction of the piezoelectric element sections is obtained by expansion and contraction in the length direction generated when voltage is applied via the conductive layers.

9. A differential type piezoelectric actuator as claimed in claim 2, wherein
   each of the piezoelectric element sections is made from conductive layers and piezoelectric material layers which are alternately layered in a thickness direction, and
   the expansion and contraction of the piezoelectric element sections is obtained by expansion and contraction in a length direction generated when voltage is applied via the conductive layers.

10. A differential typed piezoelectric actuator as claimed in claim 3, wherein
    each of the piezoelectric element sections is made from conductive layers and piezoelectric material layers which are alternately layered in a thickness direction, and
    the expansion and contraction of the piezoelectric element sections is obtained by expansion and contraction in a length direction generated when voltage is applied via the conductive layers.

11. A differential type piezoelectric actuator as claimed in claim 1, wherein
    an electrode is provided at the free end and a bottom in a length direction, of the respective piezoelectric element sections, and
    the expansion and contraction of the piezoelectric element sections is obtained by expansion and contraction in the length direction generated when voltage is applied in the length direction via the electrodes.

12. A differential type piezoelectric actuator as claimed in claim 2, wherein
    an electrode is provided at the free end and a bottom in a length direction, of the respective piezoelectric element sections, and
    the expansion and contraction of the piezoelectric element sections is obtained by expansion and contraction in the length direction generated when voltage is applied in the length direction via the electrodes.

13. A differential type piezoelectric actuator as claimed in claim 3, wherein
    an electrode is provided at the free end and a bottom in a length direction, of the respective piezoelectric element sections, and
    the expansion and contraction of the piezoelectric element sections is obtained by expansion and contraction in the length direction generated when voltage is applied in the length direction via the electrodes.

14. A differential type piezoelectric actuator as claimed in claim 1, wherein
    each of the piezoelectric element sections includes conductive layers and piezoelectric material layers which are alternately layered in a length direction, and
    the expansion and contraction of the piezoelectric element sections is obtained by expansion and contraction in the length direction generated when voltage is applied in a thickness direction via the conductive layers.

15. A differential type piezoelectric actuator as claimed in claim 2, wherein
    each of the piezoelectric element sections includes conductive layers and piezoelectric material layers which are alternately layered in a length direction, and
    the expansion and contraction of the piezoelectric element sections is obtained by expansion and contraction in the length direction generated when voltage is applied in a thickness direction via the conductive layers.

16. A differential type piezoelectric actuator as claimed in claim 3, wherein
    each of the piezoelectric element sections includes conductive layers and piezoelectric material layers which are alternately layered in a length direction, and
    the expansion and contraction of the piezoelectric element sections is obtained by expansion and contraction in the length direction generated when voltage is applied in a thickness direction via the conductive layers.

17. A differential type of piezoelectric actuator as claimed in claim 11, wherein
    each of the piezoelectric element sections includes conductive layers and piezoelectric material layers which are alternately layered in a length direction, and
    the expansion and contraction of the piezoelectric element sections is obtained by expansion and contraction in the length direction generated when voltage is applied in a thickness direction via the conductive layers.

18. A differential type piezoelectric actuator as claimed in claim 1, wherein
    each of the piezoelectric element sections is provided with electrodes arranged on both main surfaces of the piezoelectric element sections in a width direction, and
    the expansion and contraction of the piezoelectric element sections is obtained by expansion and contraction in a length direction generated when voltage is applied in the width direction via the electrodes.

19. A differential type piezoelectric actuator as claimed in claim 2, wherein each of the piezoelectric element sections is provided with electrodes arranged on both main surfaces of the piezoelectric element sections in a width direction, and the expansion and contraction of the piezoelectric element sections is obtained by expansion and contraction in a length direction generated when voltage is applied in the width direction via the electrodes.

20. A differential type piezoelectric actuator as claimed in claim 3, wherein each of the piezoelectric element sections is provided with electrodes arranged on both main surfaces of the piezoelectric element sections in a width direction, and the expansion and contraction of the piezoelectric element sections is obtained by expansion and contraction in a length direction generated when voltage is applied in the width direction via the electrodes.

21. A differential type piezoelectric actuator as claimed in claim 1, wherein each of the piezoelectric element sections includes conductive layers and piezoelectric material layers which are alternately layered in a width direction, and the expansion and contraction of the piezoelectric element sections is obtained by expansion and contraction in a length direction generated when voltage is applied in the width direction via the conductive layers.

22. A differential type piezoelectric actuator as claimed in claim 2, wherein each of the piezoelectric element sections includes conductive layers and piezoelectric material layers which are alternately layered in a width direction, and the expansion and contraction of the piezoelectric element sections is obtained by expansion and contraction in a length direction generated when voltage is applied in the width direction via the conductive layers.

23. A differential type piezoelectric actuator as claimed in claim 3, wherein each of the piezoelectric element sections includes conductive layers and piezoelectric material layers which are alternately layered in a width direction, and the expansion and contraction of the piezoelectric element sections is obtained by expansion and contraction in a length direction generated when voltage is applied in the width direction via the conductive layers.

24. A differential type piezoelectric actuator as claimed in claim 18, wherein each of the piezoelectric element sections includes conductive layers and piezoelectric material layers which are alternately layered in a width direction, and the expansion and contraction of the piezoelectric element sections is obtained by expansion and contraction in a length direction generated when voltage is applied in the width direction via the conductive layers.

* * * * *